United States Patent [19]
Heo et al.

[11] Patent Number: 5,858,815
[45] Date of Patent: Jan. 12, 1999

[54] SEMICONDUCTOR PACKAGE AND METHOD FOR FABRICATING THE SAME

[75] Inventors: Young Wook Heo, Kyungki-Do; Byung Joon Han, Seoul, both of Rep. of Korea

[73] Assignees: ANAM Semiconductor Inc., Seoul, Rep. of Korea; Amkor Technology, Inc., Chandler, Ariz.

[21] Appl. No.: 763,605

[22] Filed: Dec. 11, 1996

[30] Foreign Application Priority Data

Jun. 21, 1996 [KR] Rep. of Korea ............ 96-22901

[51] Int. Cl.⁶ .............. H01L 21/56; H01L 21/58; H01L 21/60
[52] U.S. Cl. .............. 438/112; 438/113; 438/118; 438/123; 438/124; 438/126; 438/129; 438/461; 438/611; 438/615; 438/618
[58] Field of Search ............... 438/112, 113, 438/118, 123, 124, 126, 129, 461, 611, 615, 618, 367, 377, 380

[56] References Cited

U.S. PATENT DOCUMENTS

| | | |
|---|---|---|
| 3,868,724 | 2/1975 | Perrino . |
| 4,878,098 | 10/1989 | Saito et al. . |
| 4,884,122 | 11/1989 | Eichelberger et al. . |
| 4,967,261 | 10/1990 | Niki et al. . |
| 5,148,265 | 9/1992 | Khandros et al. ............ 357/80 |
| 5,148,266 | 9/1992 | Khandros et al. ............ 357/80 |
| 5,258,330 | 11/1993 | Khandros et al. ............ 437/209 |
| 5,346,861 | 9/1994 | Khandros et al. ............ 437/209 |
| 5,347,159 | 9/1994 | Khandros et al. ............ 257/692 |
| 5,390,844 | 2/1995 | Distefano et al. ............ 228/180.21 |
| 5,398,863 | 3/1995 | Grube et al. ............ 228/106 |
| 5,414,298 | 5/1995 | Grube et al. ............ 257/690 |
| 5,455,390 | 10/1995 | DiStefano et al. ............ 174/262 |
| 5,477,611 | 12/1995 | Sweis et al. ............ 29/840 |
| 5,489,749 | 2/1996 | DiStefano et al. ............ 174/261 |
| 5,491,302 | 2/1996 | Distefano et al. ............ 114/260 |
| 5,518,964 | 5/1996 | DiStefano et al. ............ 437/209 |

*Primary Examiner*—David Graybill
*Attorney, Agent, or Firm*—Skjerven Morrill MacPherson Franklin & Friel LLP

[57] ABSTRACT

A process for manufacturing chip size semiconductor package with a light, thin, and compact structure having a reduced size of its semiconductor chip while having an increased number of pins For the package, it is possible to use either the semiconductor chip having bond pads arranged on end portions of the chip or the semiconductor chip having bond pads arranged on the central portion of the chip. In either case, input/output terminals of the package are arranged in the form of an area array. Accordingly, when the package is mounted on an electronic appliance, its mounting area can be minimized, thereby achieving a compactness of the final product.

13 Claims, 16 Drawing Sheets

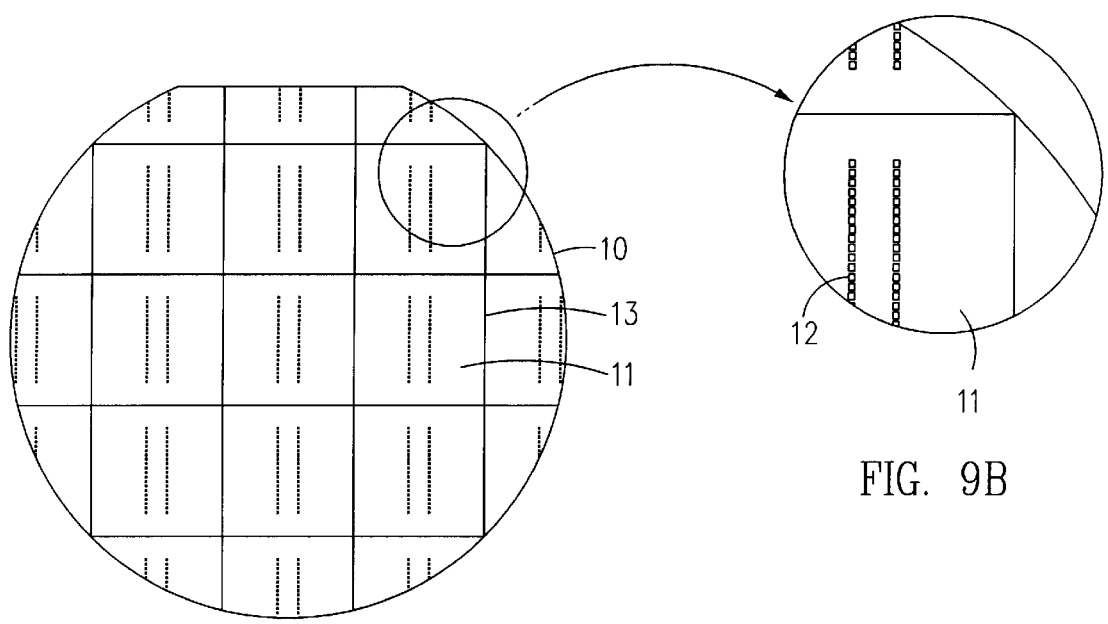
FIG. 9A
FIG. 9B
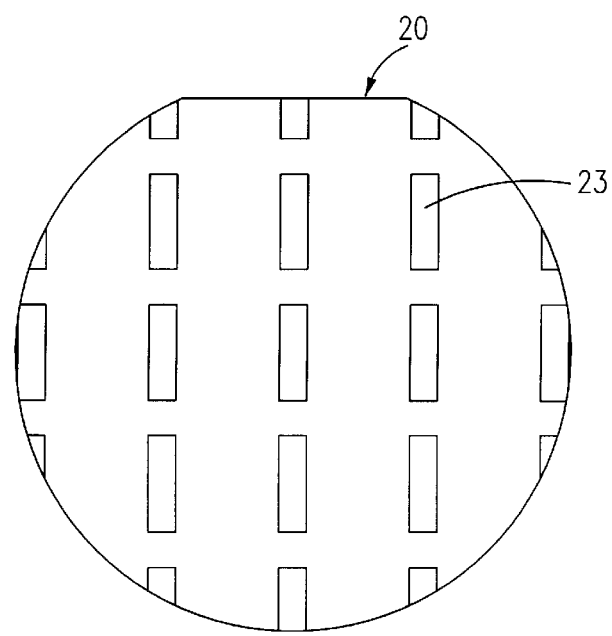
FIG. 9C

SEMICONDUCTOR PACKAGE AND METHOD FOR FABRICATING THE SAME

BACKGROUND OF THE INVENTION

1. Field of the Invention

The present invention relates to a semiconductor package and a method for fabricating the same, and more particularly to a semiconductor package with a light, thin, simple and compact structure having a size reduced to the size of its semiconductor chip and input/output terminals arranged in the form of an area array in either case using a semiconductor chip having bond pads arranged on end portions of the chip or a semiconductor chip having bond pads arranged on the central portion of the chip, thereby achieving an improvement in integration degree and performance of the package. Also, the present invention relates to a method for fabricating such a semiconductor package.

2. Description of the Prior Art

Generally, semiconductor packages are classified into resin sealed packages, TCP packages, glass sealed packages and metal sealed packages. Such semiconductor packages are also classified into insertion type semiconductor packages and surface mounting type semiconductor packages in accordance with their chip mounting structures. The representative of insertion type semiconductor packages includes dual in-line packages (DIP) and pin grid array (PGA) packages. On the other hand, the representative of surface mounting type semiconductor packages include quad flat packages (QFP), plastic leaded chip carrier (PLCC) packages, ceramic leaded chip carrier (CLCC) packages, and ball grid array (BGA) packages.

Recently, the surface mounting type semiconductor packages have been widely used as compared to the insertion type semiconductor packages in order to obtain an increased degree of mounting elements on printed circuit boards as electronic appliances have a compact structure. Conventional package structures will now be described in conjunction with FIGS. 1A and 1B respectively illustrating a QFP package and a BGA package.

FIG. 1A shows a conventional QFP package. As shown in FIG. 1A, the QFP package includes a semiconductor chip 1 having an integrated electronic circuit. The semiconductor chip 1 is attached to a mounting plate 2 by means of an epoxy resin 3. The package also includes a plurality of leads 7 adapted to transmit a signal from the semiconductor chip 1 to the outside, a plurality of wires 4 respectively connecting the leads 7 to the semiconductor chip 1, and a sealant 5 adapted to encapsulate the semiconductor chip 1 and peripheral elements, thereby protecting them from external oxidation and erosion.

In such a conventional QFP package having the above-mentioned structure, signals output from the semiconductor chip 1 are transmitted to the leads 7 via the wires 4, respectively. The signals transmitted to the leads 7 are then sent to peripheral devices via a mother board to which the leads 7 are coupled. On the other hand, transmission of signals generated from the peripheral devices to the semiconductor chip 1 is carried out in a manner reverse to the above-mentioned manner.

However, such a QFP package has a technical difficulty in reducing the interval between adjacent pins. The recent trend to fabricate semiconductor chips having a high performance results in an increase in the number of pins. In order to contain such an increased number of pins, the QFP package becomes bulky. This brings an adverse effect on the compactness of the package.

BGA packages are known to solve a technical requirement for an increase in the number of pins. Such BGA packages have input/output means comprising solder balls bonded to one package surface. By virtue of such solder balls, BGA packages can contain an increased number of input/output signals as compared to QFP packages while having a reduced size. Referring to FIG. 1B, an example of such BGA packages is illustrated. As shown in FIG. 1B, the BGA package includes a circuit board 8 having a circuit pattern 8a formed on the upper surface of the circuit board 8 and a solder mask 8b coated on the circuit pattern 8a to protect the circuit pattern 8a. A semiconductor chip 1 is attached to the central portion of the upper surface of the circuit board 8. A plurality of wires 4 are connected between the semiconductor chip 1 and the circuit pattern 8a of the circuit board 8 so that signals can be transmitted between the semiconductor chip 1 and circuit pattern 8a. The BGA package also includes a plurality of solder balls 6 bonded to the circuit pattern 8a of the circuit board 8 and adapted to transmit signals from the package to the outside, and a sealant 5 adapted to encapsulate the semiconductor chip 1 and peripheral elements, thereby protecting them from external oxidation and erosion.

In such a conventional BGA package having the above-mentioned structure, signals output from the semiconductor chip 1 are transmitted to the circuit pattern 8a via the wires 4, respectively. The signals transmitted to the circuit pattern 8a are then sent to a mother board via the solder balls 6 and then transmitted to peripheral devices. On the other hand, transmission of signals generated from the peripheral devices to the semiconductor chip 1 is carried out in a manner reverse to the above-mentioned manner.

However, such a BGA package has a size corresponding to several times the size of the semiconductor chip contained therein. As a result, the BGA package has a limitation in reducing the size of electronic appliances using it. Moreover, the circuit board of the BGA package is expensive, thereby resulting in an increase in cost of final products. In particular, moisture may penetrate into the circuit board, thereby resulting in generation of cracks.

SUMMARY OF THE INVENTION

Therefore, an object of the invention is to solve the above-mentioned problems and to provide a semiconductor package with a light, thin, simple and compact structure having a size reduced to the size of its semiconductor chip while increasing the number pins contained in the package and without degrading its functions, thereby minimizing its mounting area when the package is mounted on an electronic appliance such as a communication unit or computer, so that the final product can have a compact size.

Another object of the invention is to provide a method for fabricating a semiconductor package having the above-mentioned structure, namely, a chip size package.

In accordance with one aspect, the present invention provides a semiconductor package comprising: a semiconductor chip having an integrated electronic circuit and a plurality of bond pads each adapted to send a signal from the electronic circuit to the outside; a multi-layer film attached to an upper surface of the semiconductor chip by adhesive means in a region where the bond pads do not exist, the multi-layer film having a double non-conductive film layer structure provided with an interposed conductive circuit pattern; a plurality of wires connected between the semiconductor chip and the circuit pattern in such a manner that a signal transmission is carried out between the semiconductor chip and the circuit pattern; a sealant adapted to protect regions, where the wires are bonded, from external oxidation and erosion; and a plurality of solder balls bonded to the circuit pattern and adapted to send signals transmitted from the semiconductor chip via the wires to the outside.

In accordance with another aspect, the present invention provides a method for fabricating a semiconductor package comprising the steps of: forming a wafer which is a raw material for providing semiconductor chips each having an integrated electronic circuit and a plurality of bond pads each adapted to send a signal from the electronic circuit to the outside; forming a multi-layer film which has the same size as the wafer, consists of two non-conductive film layers, and is provided with a plurality of conductive circuit patterns interposed between the layers and opened portions in regions where the bond pads of the semiconductor chips are disposed; attaching the multi-layer film to the wafer by adhesive means in such a manner the bond pad regions defined at the semiconductor chips of the wafer are exposed through the opened portions of the multi-layer film; bonding bond fingers provided at the circuit patterns of the multi-layer film to the bond pads of the semiconductor chips by wires, respectively; covering a sealant layer over the opened portions of the multi-layer film, thereby protecting the wires from external oxidation and erosion; baking the sealant layer in an oven or furnace at a temperature of 150° C. or more; seating solder balls on solder ball lands provided at the multi-layer film, respectively, and reflowing the solder balls in the oven or furnace at a temperature of 200° C. or more, thereby bonding the solder balls to the circuit patterns; cutting the wafer along its street lines using a sawing device so that it can be divided into individual semiconductor chips, thereby forming chip size packages having the same size as their semiconductor chips.

BRIEF DESCRIPTION OF THE DRAWINGS

Other objects and aspects of the invention will become apparent from the following description of embodiments with reference to the accompanying drawings in which:

FIGS. 9A, 9C and 9D are plan views respectively showing the condition in which a non-conductive film is attached to a wafer in accordance with the fabricating method of the second embodiment of the present invention;

FIGS. 9B and 9E are enlarged views of the circled portions of FIGS. 9B and 9E, respectively;

DETAILED DESCRIPTION OF THE PREFERRED EMBODIMENTS

Figure 1A:
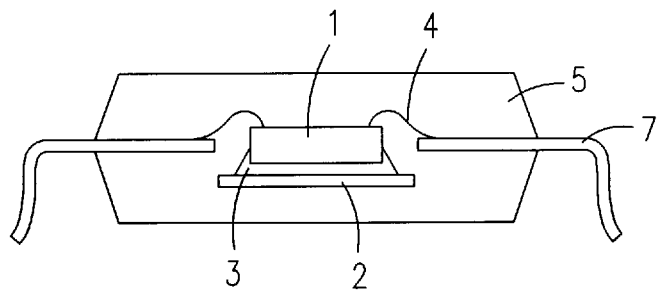
FIGS. 1A and 1B are sectional views respectively illustrating a conventional QFP package and a BGA package.
Figure 1B:
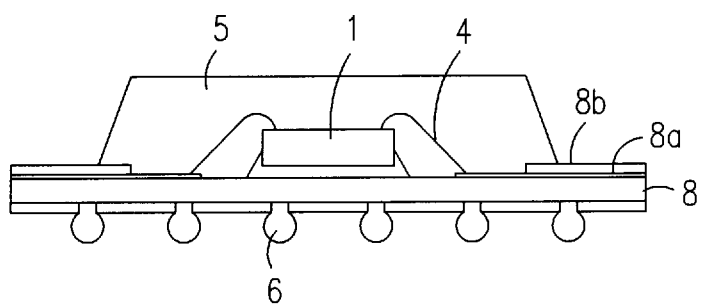
Figure 2A:
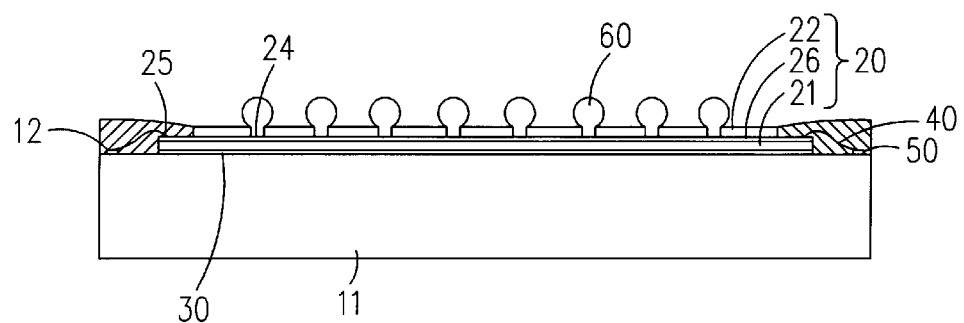
FIGS. 2A and 2B are a sectional view and a plan view respectively illustrating a semiconductor package according to a first embodiment of the present invention.
Figure 2B:
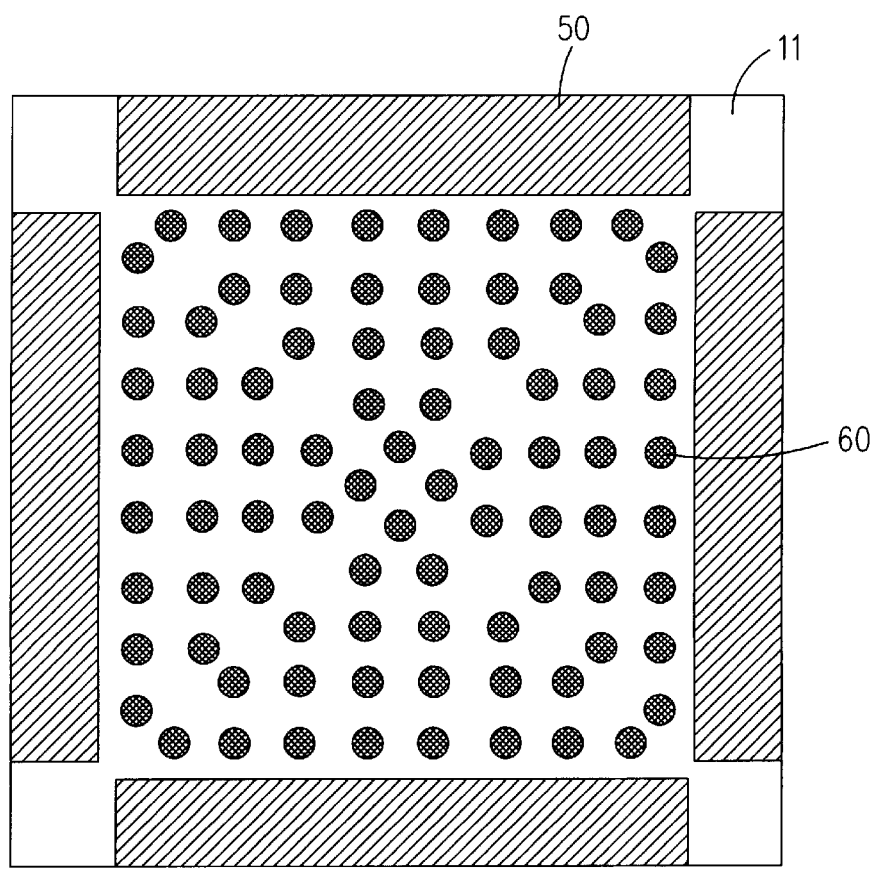

FIGS. 2A and 2B illustrate a semiconductor package according to a first embodiment of the present invention, respectively. As shown in FIGS. 2A and 2B, the semiconductor package includes a semiconductor chip 11 having an integrated electronic circuit. The semiconductor chip 11 is also provided with a plurality of bond pads 12 each adapted to send a signal from the electronic circuit to the outside. A multi-layer film 20 is attached to the upper surface of the semiconductor chip 11 by an adhesive means 30 in a region where the bond pads 12 do not exist. The multi-layer film 20 consists of two non-conductive film layers and a circuit pattern layer. A conductive circuit pattern 26 is interposed between the layers of the non-conductive films 21, 22. A plurality of wires 40 are connected between the semiconductor chip 11 and the circuit pattern 26 so that signals can be transmitted between the semiconductor chip 11 and circuit pattern 26. The package also includes a sealant 50 adapted to protect regions, where the wires 40 are bonded, from external oxidation and erosion, and a plurality of solder balls 60 bonded to the circuit pattern 26 and adapted to send signals transmitted from the semiconductor chip 11 via the wires 40 to the outside.

Figure 13:
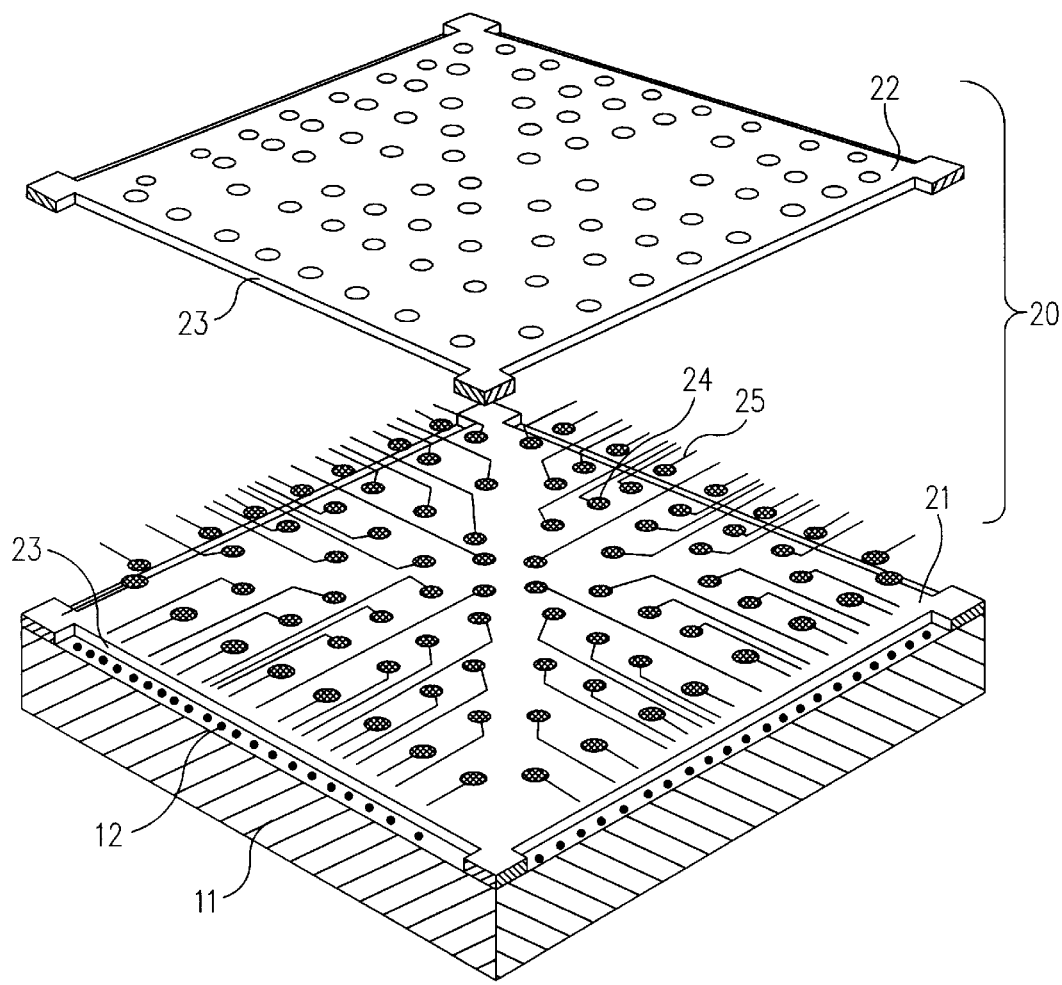
FIG. 13 is an exploded perspective view of the nonconductive film according to the present invention.

The bond pads 12 are arranged along all end portions of the upper surface of the semiconductor chip 11. As shown in FIG. 13, the multi-layer film 20 includes a first non-conductive film 21, a second non-conductive film 22 and a circuit pattern 26. The circuit pattern 26 is interposed between the first and second non-conductive films 21 and 22. A conductive layer is formed to a thickness of 20 $\mu$m or less on the first non-conductive film 21 and then patterned to form the circuit pattern 26. After the formation of the circuit pattern 26, the second non-conductive film 22 is laminated on the circuit pattern 26. Thus, the formation of the multi-layer film 20 along with the circuit pattern 26 is achieved. The second non-conductive film 22 is opened in regions where the solder balls 60 are bonded to the circuit pattern 26, thereby defining solder ball lands 24. As shown in FIG. 2B, the solder ball lands 24 are regularly arranged. The second non-conductive film 22 is also opened in the regions where bond fingers 25 provided at the circuit pattern 26 are disposed so that the bond fingers 25 can be connected to the bond pads 12 by the wires 40.

The non-conductive films 21, 22 may be made of a polymer tape or polyimide. On the other hand, the circuit pattern 26 may be made of a copper foil or conductor. In order to enhance the bonding force of the solder balls 60 and wires 40, nickel or gold is plated on portions of the upper surface of the circuit pattern 26 exposed through the solder ball lands 24 and on the bond fingers 25.

The adhesive means 30, which serves to attach the first non-conductive film 21 to the semiconductor chip 11, comprises an epoxy adhesive or an adhesive film. The sealant 50, which serves to protect the wire bonding regions, comprises a polyimide coating solution or an epoxy type encapsulation material. This material is coated over the wire bonding regions so that it can completely cover the wires 40.

The semiconductor package having the above-mentioned structure in accordance with the present invention is a chip size package having the same size as that of its semiconductor chip. In this semiconductor package, signals output from the semiconductor chip 11 are transmitted to the circuit pattern 26 via the wires 40, respectively. Thereafter, the signals transmitted to the circuit pattern 26 are sent to a mother board via the solder balls 60 and then transmitted to peripheral devices. On the other hand, transmission of signals generated from the peripheral devices to the semiconductor chip 11 is carried out in a manner reverse to the above-mentioned manner.

Now, a method for fabricating chip size packages having the above-mentioned structure in accordance with the present invention will be described. The method includes the step of providing a wafer 10 forming semiconductor chips 11 each having an integrated electronic circuit and a plurality of bond pads 12 each adapted to send a signal from the electronic circuit to the outside. After the formation of the wafer 10, the formation of a multi-layer film 20 having the same size as the wafer 10 is carried out. The multi-layer film 20 consists of two non-conductive film layers and has a plurality of conductive circuit patterns 26 interposed between the layers of the non-conductive films 21, 22. The multi-layer film 20 also has opened portions 23 in regions where the bond pads 12 of the semiconductor chips 11 are disposed. The method also includes the steps of attaching the multi-layer film 20 to the wafer 10 by an adhesive means 30 in such a manner that the bond pad regions defined at the semiconductor chips 11 of the wafer 10 are exposed through the opened portions 23 of the multi-layer film 20, bonding bond fingers 25 provided at the circuit patterns 26 of the multi-layer film 20 to the bond pads 12 of the semiconductor chips 11 by wires 40, respectively, covering a sealant layer 50 over the opened portions 23 of the non-conductive film 20, thereby protecting the wires 40 from external oxidation and erosion, baking the sealant layer 50 in an oven or furnace at a temperature of 150° C. or more, seating solder balls 60 on solder ball lands 24 provided at the multi-layer film 20, and reflowing the solder balls 60 in the oven or furnace at a temperature of 200° C. or more, thereby bonding the solder balls 60 to the circuit patterns 26. After completing the above steps, the wafer 10 is cut along its street lines 13 using a sawing device so that it can be divided into individual semiconductor chips 11, thereby forming chip size packages having the same size as their semiconductor chips 11.

This method will now be described in detail in conjunction with FIGS. 3A to 7C.

Figure 3A:
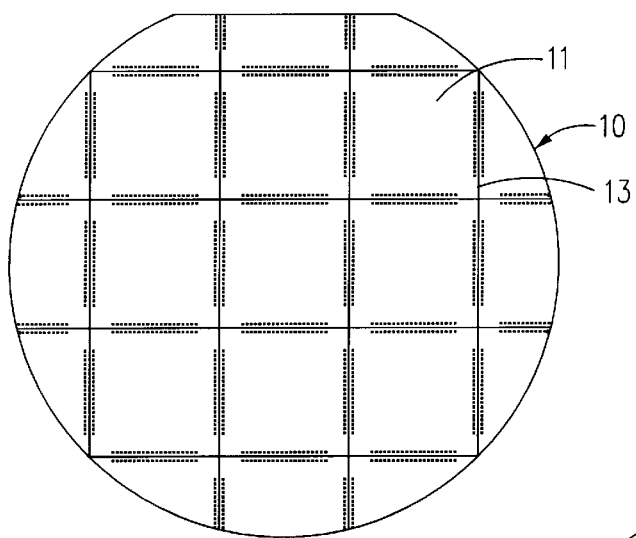
FIGS. 3A to 3C are plan views respectively showing the condition in which a non-conductive film is attached to a wafer in accordance with the first embodiment of the present invention.
Figure 3B:
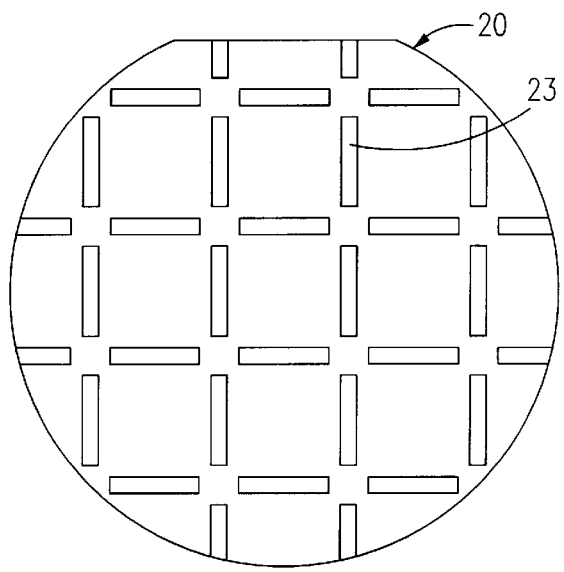
Figure 3C:
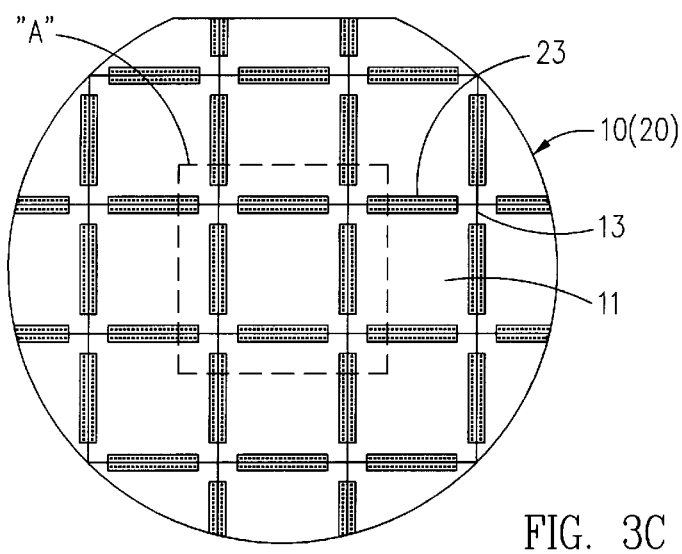

FIG. 3A is a plan view illustrating the wafer 10 formed semiconductor chips 11 whereas FIG. 3B illustrates the multi-layer film 20 which has the same size as the wafer 10. On the other hand, FIG. 3C shows the condition in which the multi-layer film 20 is attached to the wafer 10. Each semiconductor chip 11 has an integrated electronic circuit and a plurality of bond pads 12 each adapted to send a signal from the electronic circuit to the outside. The multi-layer film 20 consists of two non-conductive film layers and is interposed between the layers of the non-conductive films 21, 22. The multi-layer film 20 also has opened portions 23 in regions where the bond pads 12 of the semiconductor chips 11 are disposed. The bond pads 12 associated with each semiconductor chip 11 are arranged along all end portions of the upper surface of the semiconductor chip 11.

The formation of the multi-layer film 20, which consists of two non-conductive film layers and a conductive layer, is achieved by patterning a conductive layer to form the circuit pattern 26 to a thickness of 20 $\mu$m or less on a lower, first non-conductive film 21, and laminating a second non-conductive film 22 on the conductive circuit pattern 26. The second non-conductive film 22 is opened in regions where the solder balls 60 are bonded to the circuit pattern 26, thereby defining solder ball lands 24 arranged in the form of an array. The second non-conductive film 22 is also opened in the regions where bond fingers 25 provided at the circuit patterns 26 are disposed so that the bond fingers 25 can be connected to the bond pads 12 by the wires 40. That is, the bond fingers 25 are exposed on the outside of the opened portions 23 of the multi-layer film 20.

Thereafter, the multi-layer film 20 is attached to the wafer 10 by the adhesive means 30. This attachment is carried out under the condition in which the opened portions 23 of the multi-layer film 20 are disposed in the bond pad regions of the wafer 10 so that the bond pads 12 are exposed through the opened portions 23, as shown in FIG. 3C. For the adhesive means 30, an epoxy adhesive or adhesive film may be used.

Figure 4A:
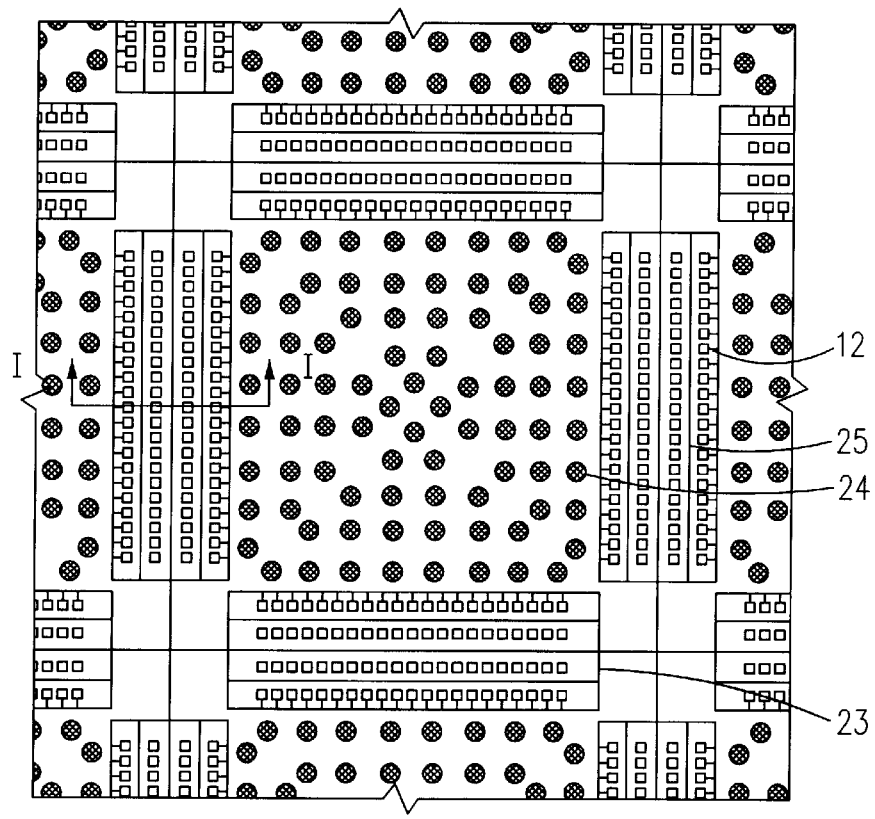
FIG. 4A is an enlarged view of the portion "A" of FIG. 3C.
Figure 4B:
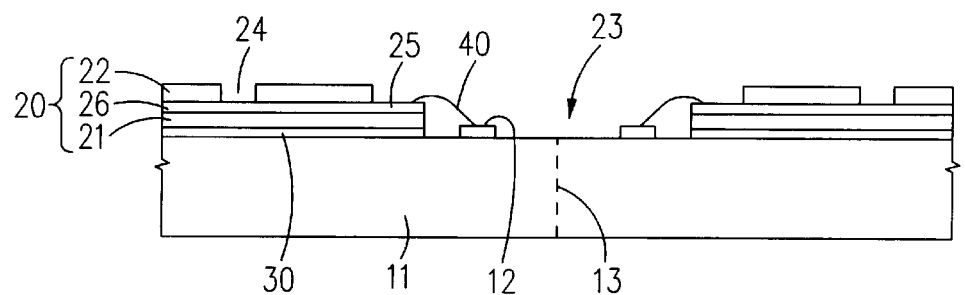
FIG. 4B is an enlarged cross-sectional view taken along the line I—I in FIG. 4A.

FIG. 4A is an enlarged view of the portion "A" of FIG. 3C. FIG. 4B is an enlarged sectional view showing one opened portion 23 of the multi-layer film 20 attached to the wafer 10.

Figure 5A:
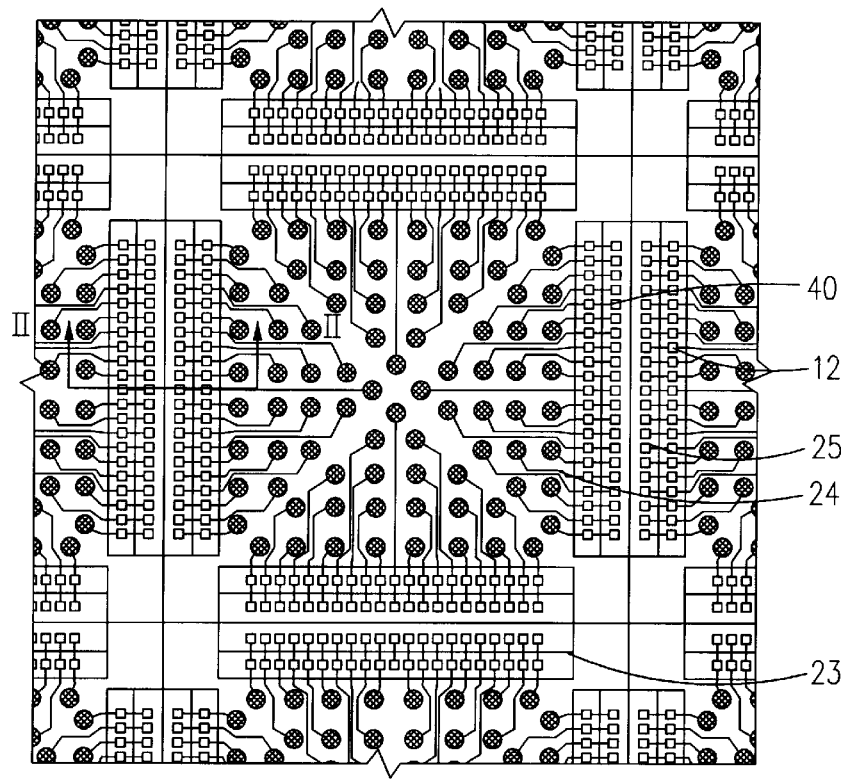
FIG. 5A is a plan view showing the wire bonding condition according to the first embodiment of the present invention.
Figure 5B:
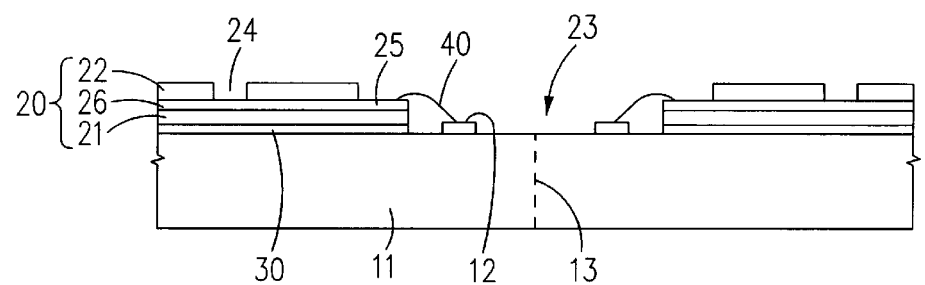
FIG. 5B is an enlarged cross-sectional view taken along the line II—II in FIG. 5A.

On the other hand, FIGS. 5A and 5B show the condition in which the bond fingers 25 provided at the circuit patterns 26 of the multi-layer film 20 are bonded to the bond pads 12 exposed through the opened portions 23 of the multi-layer film 20 by the wires 40.

Figure 6A:
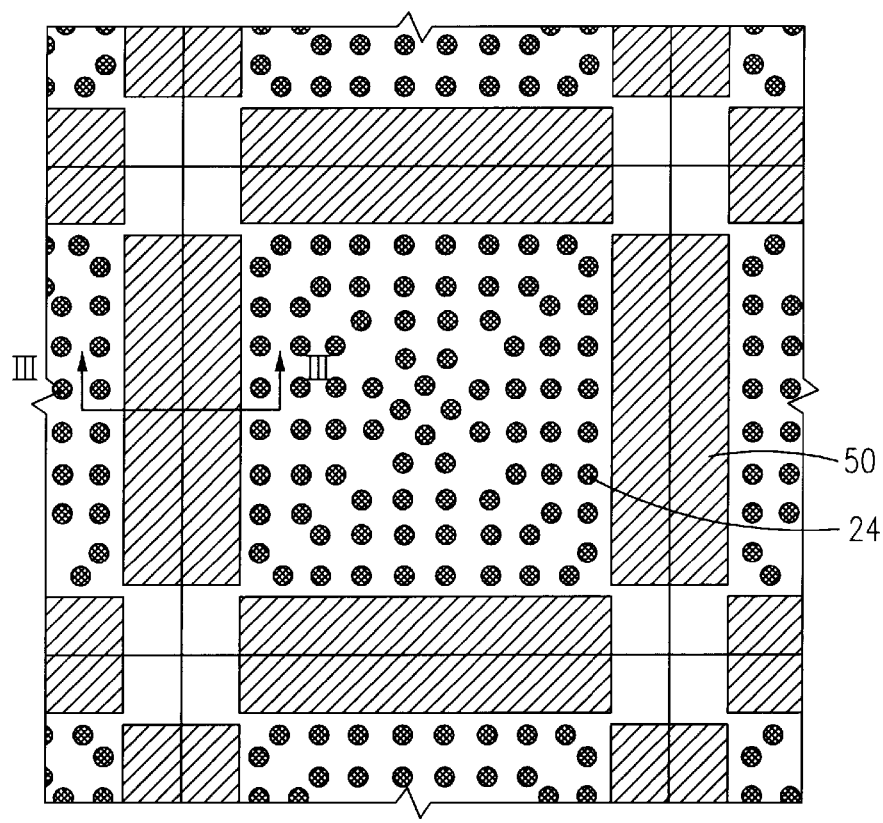
FIG. 6A is a plan view showing the condition in which a sealant is filled in wire bonding regions in accordance with the fabricating method of the first embodiment of the present invention.
Figure 6B:
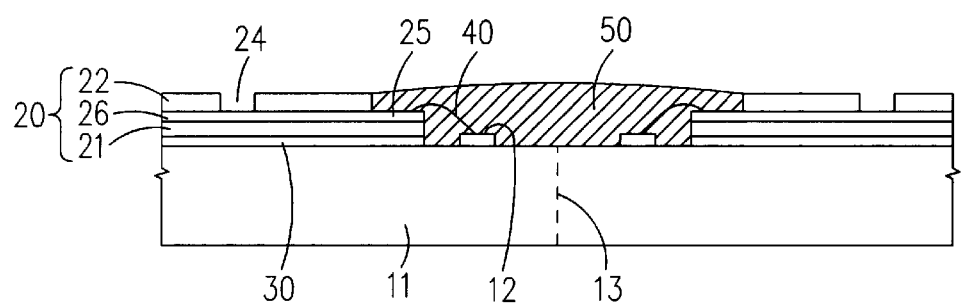
FIG. 6B is an enlarged cross-sectional view taken along the line III—III in FIG. 6A.

After bonding the bond fingers 25 to the bond pads 12, the opened portions 23 of the multi-layer film 20 are covered with the sealant 50 so as to protect the wires 40 from external oxidation and erosion, as shown in FIGS. 6A and 6B which illustrate the fabricating method of the first embodiment of the present invention. The sealant 50 may comprise a polyimide coating solution or an epoxy type encapsulation material. This material is coated over the wire bonding regions so that it can completely cover the wires 40.

The sealant 50 is then baked in an oven or furnace at a temperature of 150° C. or above.

Figure 7A:
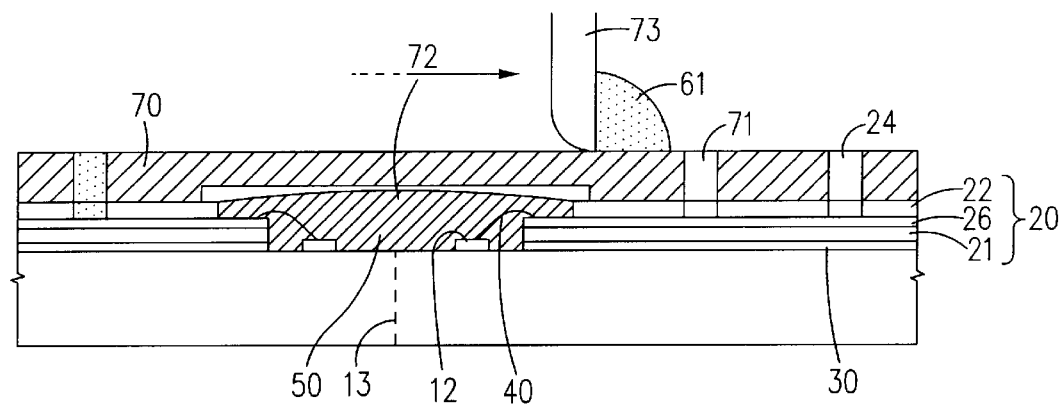
FIGS. 7A to 7C are sectional views respectively illustrating a method for forming solder balls in accordance with the fabricating method of the first embodiment of the present invention.
Figure 7B:
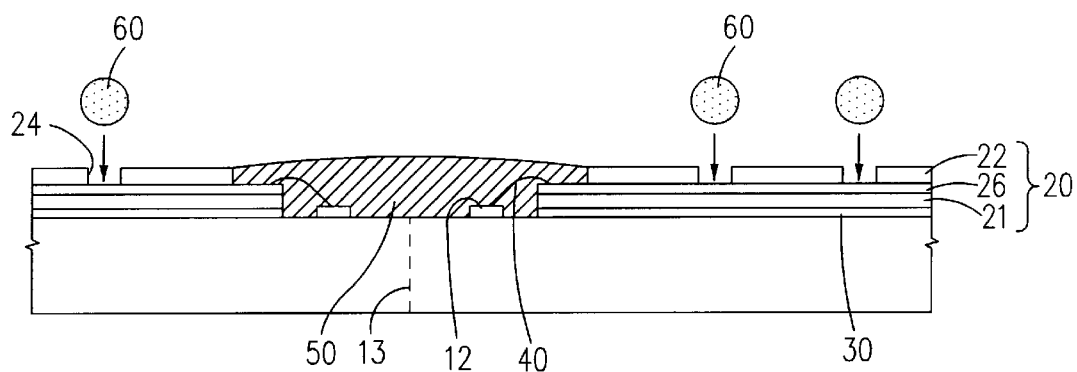
Figure 7C:
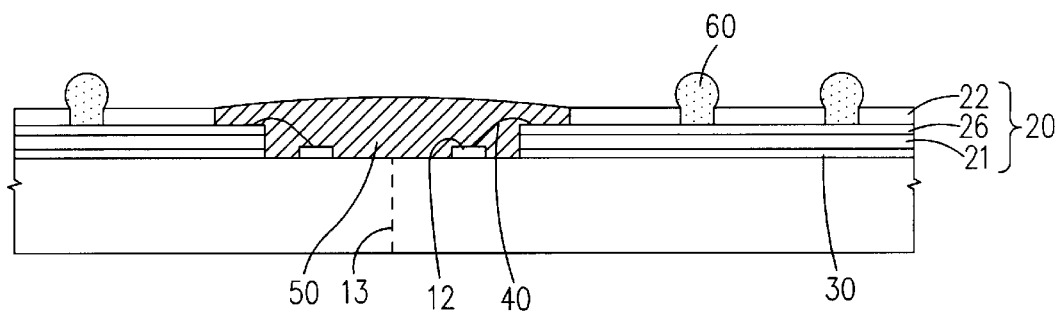
Figure 8A:
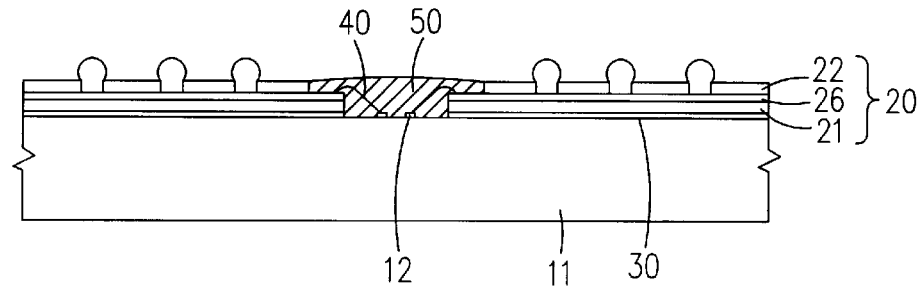
FIGS. 8A and 8B are a sectional view and a plan view respectively illustrating a semiconductor package according to a second embodiment of the present invention.
Figure 8B:
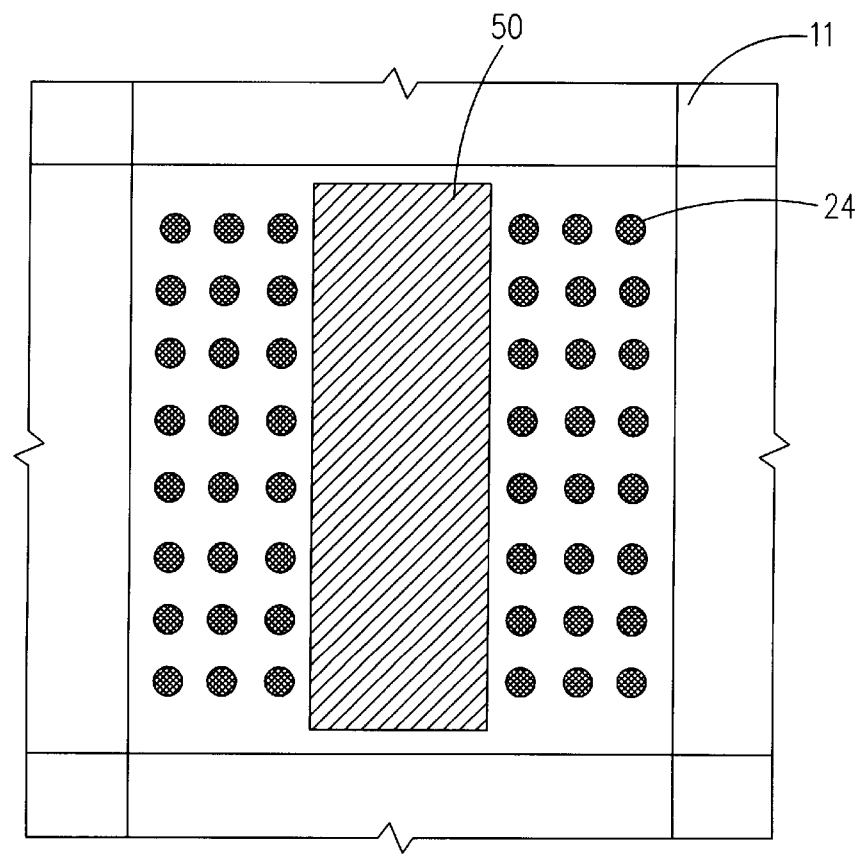

FIG. 7A to 7C show formation of solder balls 60 on the solder ball lands 24 of the multi-layer film 20 carried out after the baking of the sealant 50, respectively. In the case shown in FIG. 7A, the formation of solder balls 60 is carried out by using a stencil screen printer 70 having a plurality of throughout holes 71 respectively corresponding to the solder ball lands 24. In this case, the stencil screen printer 70 is laid on the multi-layer film 20, and solder powder 61 is then disposed on the stencil screen printer 70. The solder power 61 is then filled in the throughout holes 71 on the solder ball lands 24 by blading the solder powder 61 using a blade 73. Thereafter, the solder powder 61 filled in the throughout holes 71 are baked in the oven or furnace at a temperature of 220° C. or more, thereby forming solder balls 60 as shown in FIG. 7C. In this case, the stencil screen printer 70 is provided with grooves 72 at portions of its bottom surface respectively corresponding to regions where the sealant 50 is coated, so that the sealant 50 can be protected.

In the case of FIG. 7B, spherical solder balls 60, which are separately prepared, are seated on the solder ball lands 24 of the multi-layer film 20, respectively. Thereafter, the solder balls 60 are heated in the oven or furnace at a temperature of 220° C. or more so that it can reflow. As the solder balls 60 reflow, they are bonded to the circuit patterns 26, as shown in FIG. 7C.

In order to effectively bond the solder balls 60 to the solder ball lands 24, flux is coated on the solder ball lands 24 prior to the reflowing of the solder balls 60. After completing the reflowing of the solder balls 60, a cleaning process is conducted to remove unnecessary residue of the flux.

After the formation of solder balls 60, the resulting wafer 10 is cut along its street lines 13 using a sawing device so that it can be divided into individual semiconductor chips 11. Thus, chip size packages having the same size as their semiconductor chips 11 are obtained.

The chip size packages have a light, thin, simple and compact structure while including an increased number of pins. In other words, the chip size packages fabricated according to the present invention are semiconductor packages each having a new structure having the same size as that of its semiconductor chip.

FIG. 8 to FIG. 12 illustrate a second embodiment of the present invention. In said Figs., FIGS. 8A and 8B illustrate a semiconductor package fabricated in accordance with the second embodiment, respectively. Although this semiconductor package has the same basic structure as the semiconductor package shown in FIGS. 2A and 2B, it is different from the latter semiconductor package in that bond pads 12 are provided at the central portion of the semiconductor chip 11. In this case, accordingly, the non-conductive film 20 is attached to portions of the upper surface of the semiconductor chip 11 except for the central portion of the semiconductor chip 11. The solder balls 60, which serves to send signals from the semiconductor chip 11 to the outside of the package, are regularly arranged on the upper surface of the package except for the central portion of the package in the region where the bond pads 12 are formed. The operation of the package according to the second embodiment is identical to that of the package according to the first embodiment.

Figures 9D, 9E:
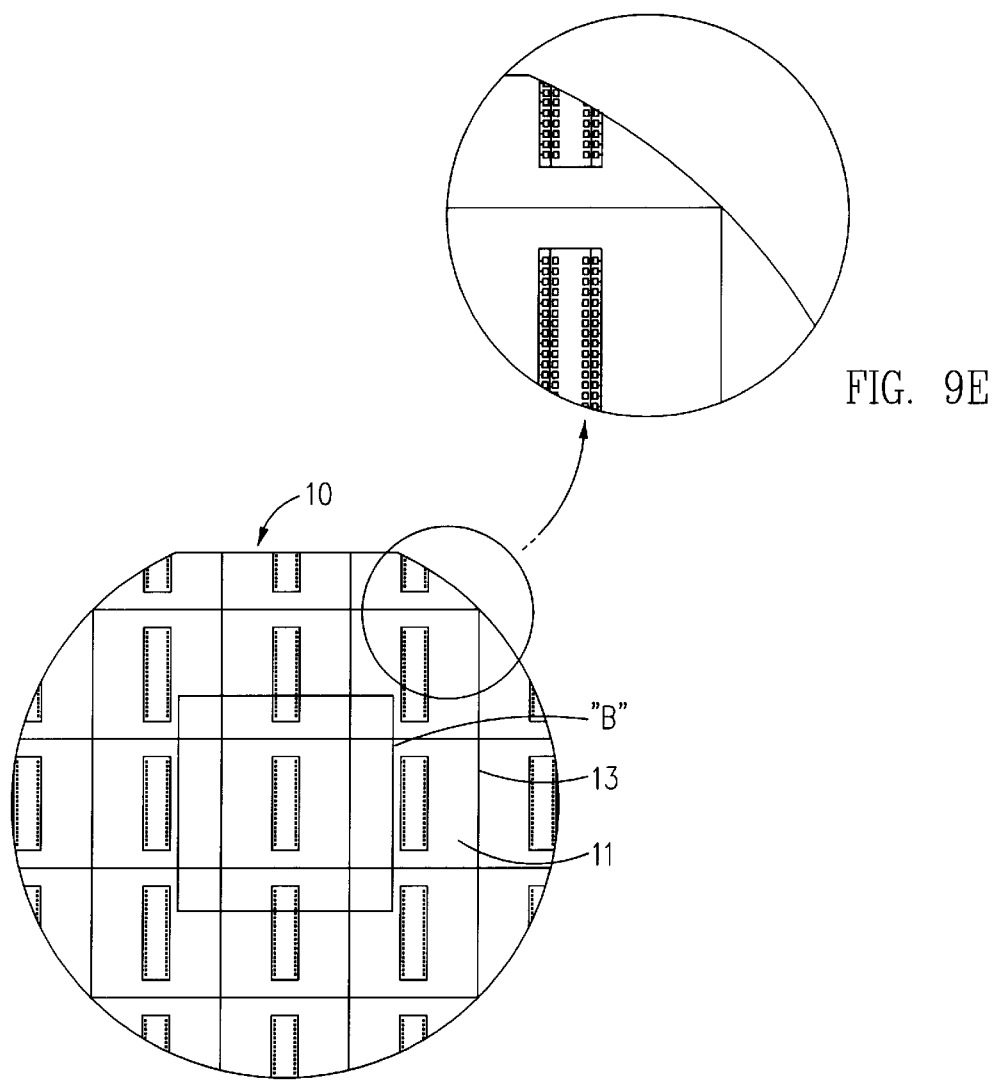
Figure 10A:
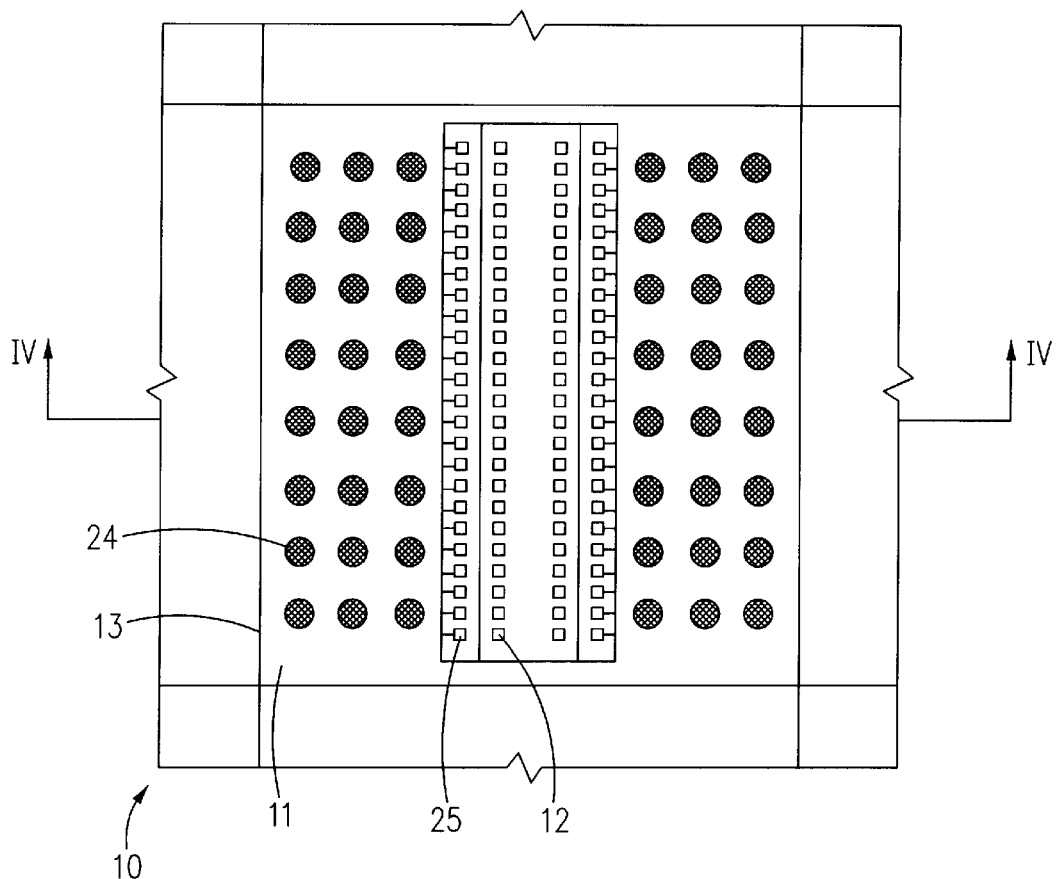
FIG. 10A is an enlarged view of the portion "B" of FIG. 9C.
Figure 10B:
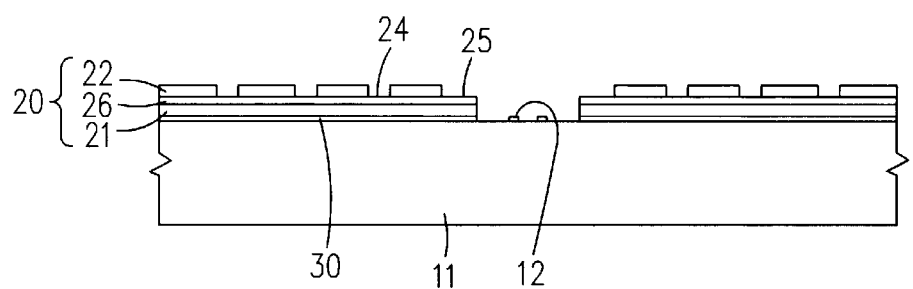
FIG. 10B is an enlarged cross-sectional view taken along the line IV—IV in FIG. 10A.

The fabrication of this package is carried out in the same manner as that of the package according to the first embodiment of the present invention. This will now be described in detail in conjunction with FIGS. 9A to 12B. A wafer 10 is provided with semiconductor chips 11 each having bond pads 12 at the central portion thereof (FIG. 9A). A multi-layer film 20 is then attached to the wafer 10. The multi-layer film 20 has the same size as the wafer 10 and is provided with a plurality of conductive circuit patterns 26. The multi-layer film 20 also has opened portions 23 in regions where the bond pads 12 of the semiconductor chips 11 are disposed (FIG. 9C). The bond pad regions correspond to the central portions of semiconductor chips 11, respectively. The attachment of the multi-layer film 20 to the wafer 10 is carried out in such a manner that the opened portions 23 of the multi-layer film 20 are disposed in the bond pad regions defined at the semiconductor chips 11 of the wafer 10, so that the bond pads 12 can be exposed through the opened portions 23 (FIG. 9D).

Figure 11A:
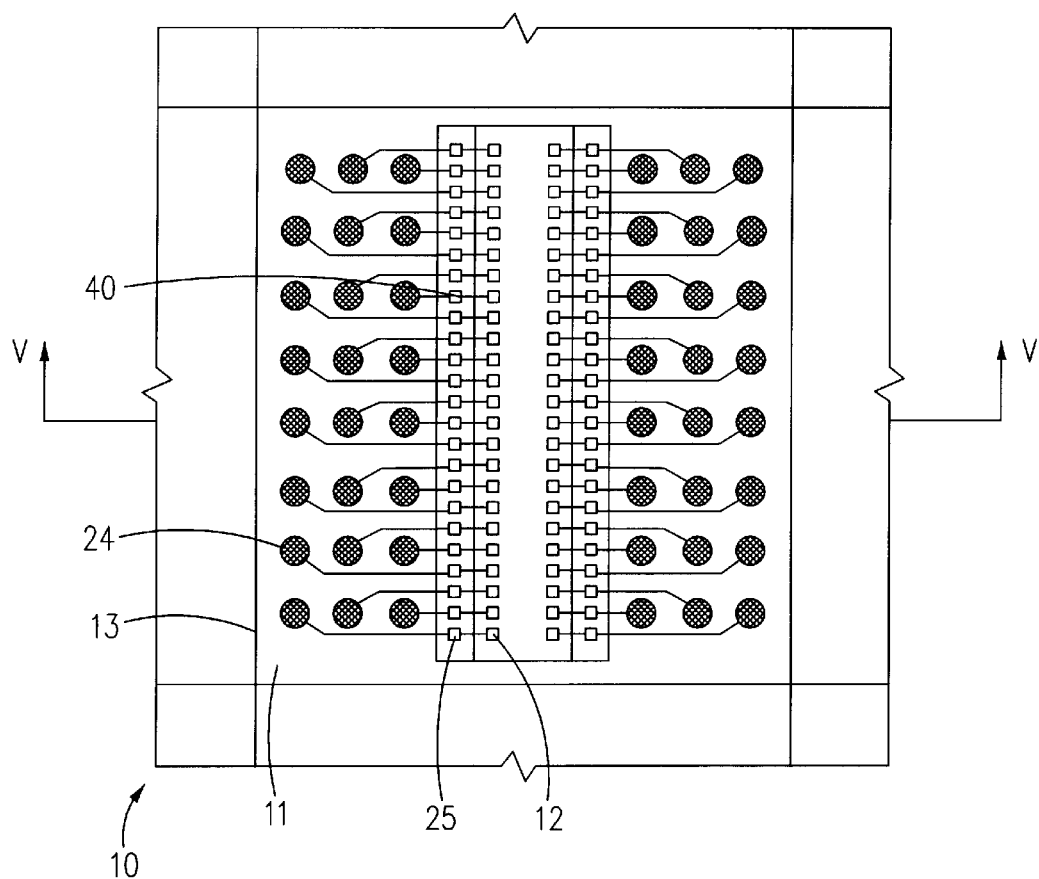
FIG. 11A is a plan view showing the wire bonding condition according to the second embodiment of the present invention.
Figure 11B:
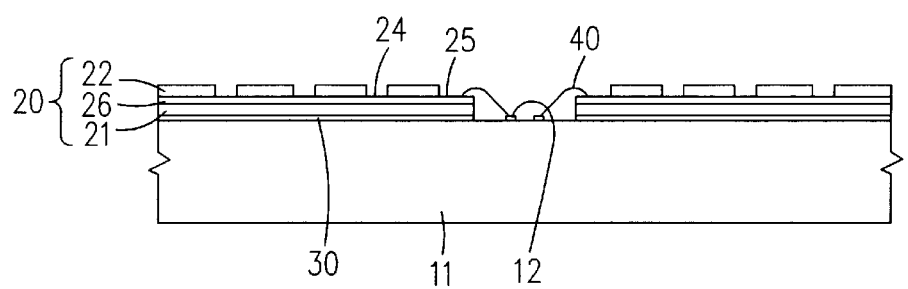
FIG. 11B is an enlarged cross-sectional view taken along the line V—V in FIG. 11A.
Figure 12A:
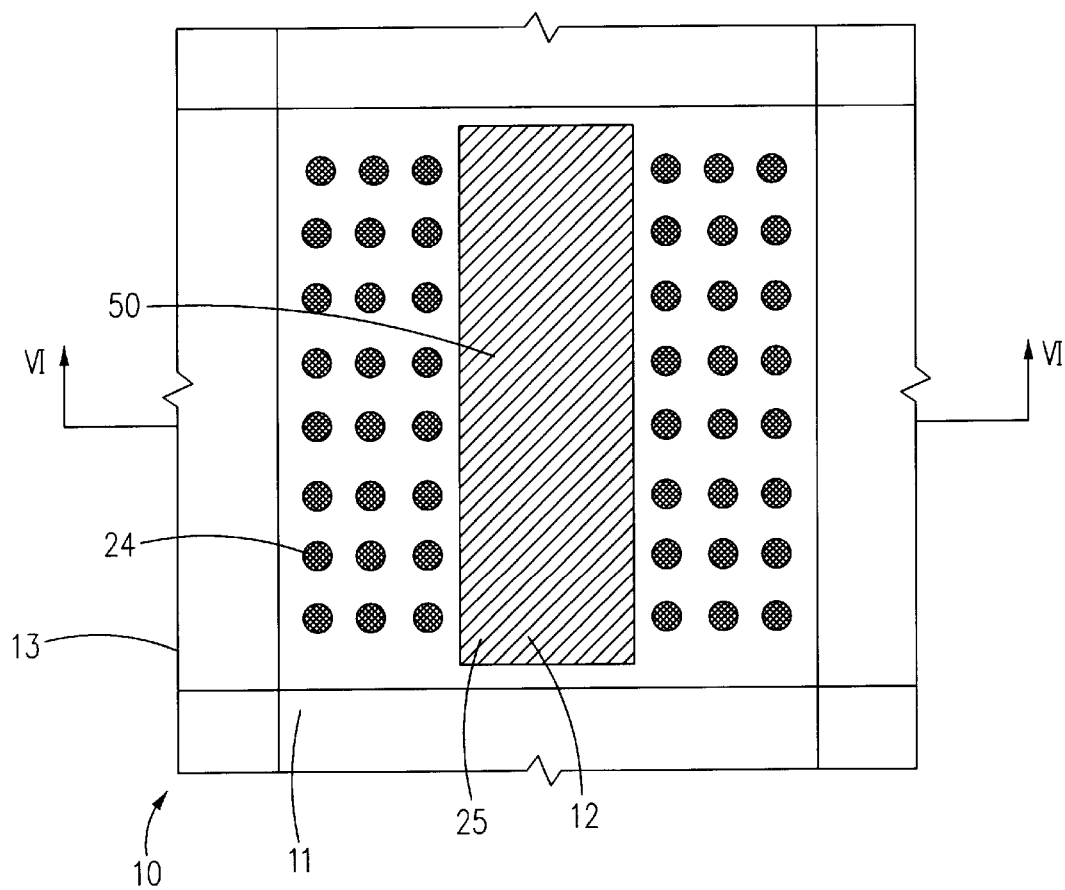
FIG. 12A is a plan view showing the condition in which a sealant is filled in wire bonding regions in accordance with the fabricating method of the second embodiment of the present invention.
Figure 12B:
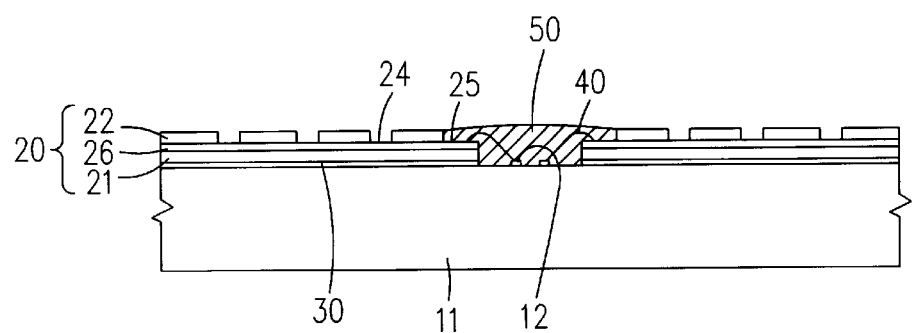
FIG. 12B is an enlarged cross-sectional view taken along the line VI—VI in FIG. 12A.

Thereafter, bond fingers 25 provided at the circuit patterns 26 of the multi-layer film 20 are bonded to the bond pads 12 of the semiconductor chips 11 by the wires 40, as shown in FIGS. 11A and 11B. The opened portions 23 of the multi-layer film 20 are then covered with a sealant layer 50 so that the wires 40 can not be exposed, as shown in FIGS. 12A and 12B.

Subsequently, the sealant layer 50 is baked in an oven or furnace at a temperature of 150° C. or more. Solder balls 60 are then seated on solder ball lands 24 provided at the multi-layer film 20. The solder balls 60 are then heated in the oven or furnace at a temperature of 220° C. or more so that it can reflow. As the solder balls 60 reflow, they are bonded to the circuit patterns 26.

After completing the above steps, the wafer 10 is cut along its street lines using a sawing device so that it can be divided into individual semiconductor chips 11, thereby forming chip size packages having the same size as their semiconductor chips 11.

As apparent from the above description, even when a semiconductor chip having bond pads at its central portion is used, it is possible to fabricate a chip size package by arranging regularly input/output terminals on one surface of the package.

Figure 14A:
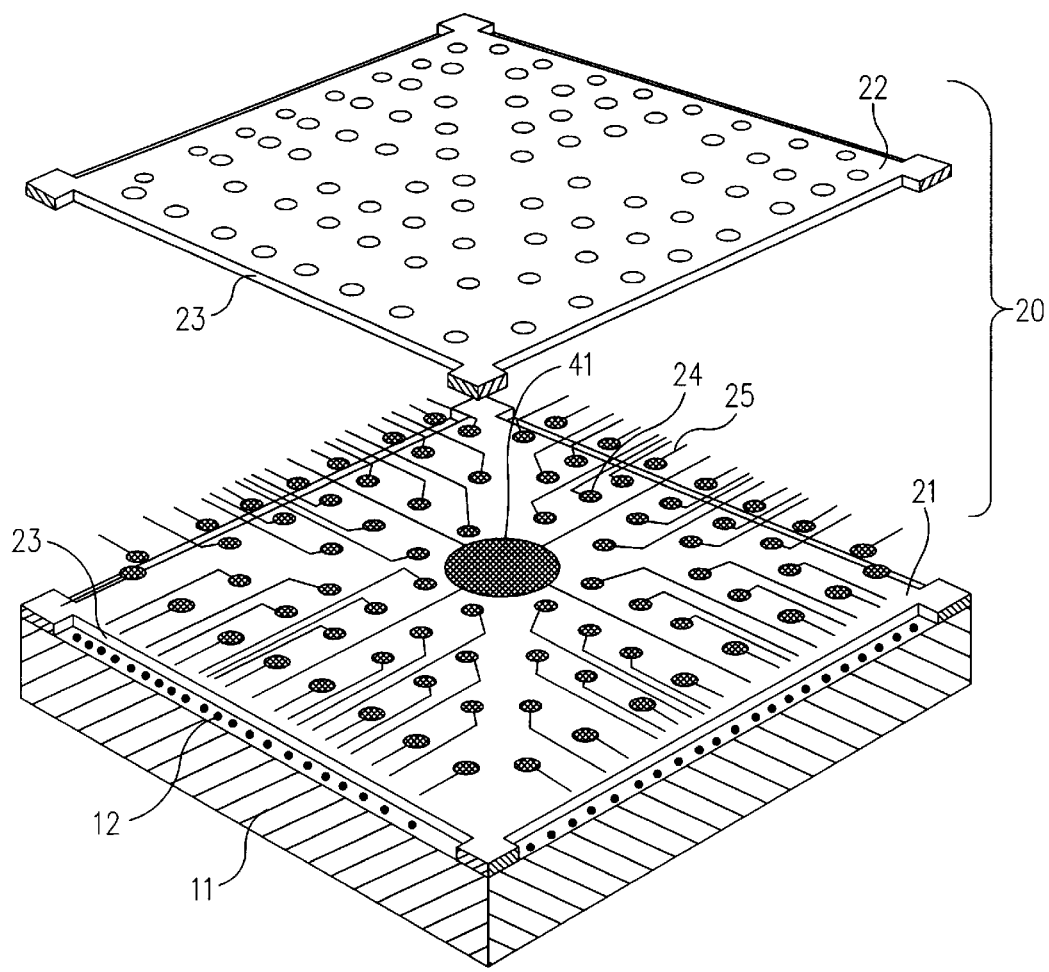
FIGS. 14A and 14B are exploded perspective views respectively illustrating different embodiments of a circuit pattern provided at the non-conductive film according to the present invention.
Figure 14B:
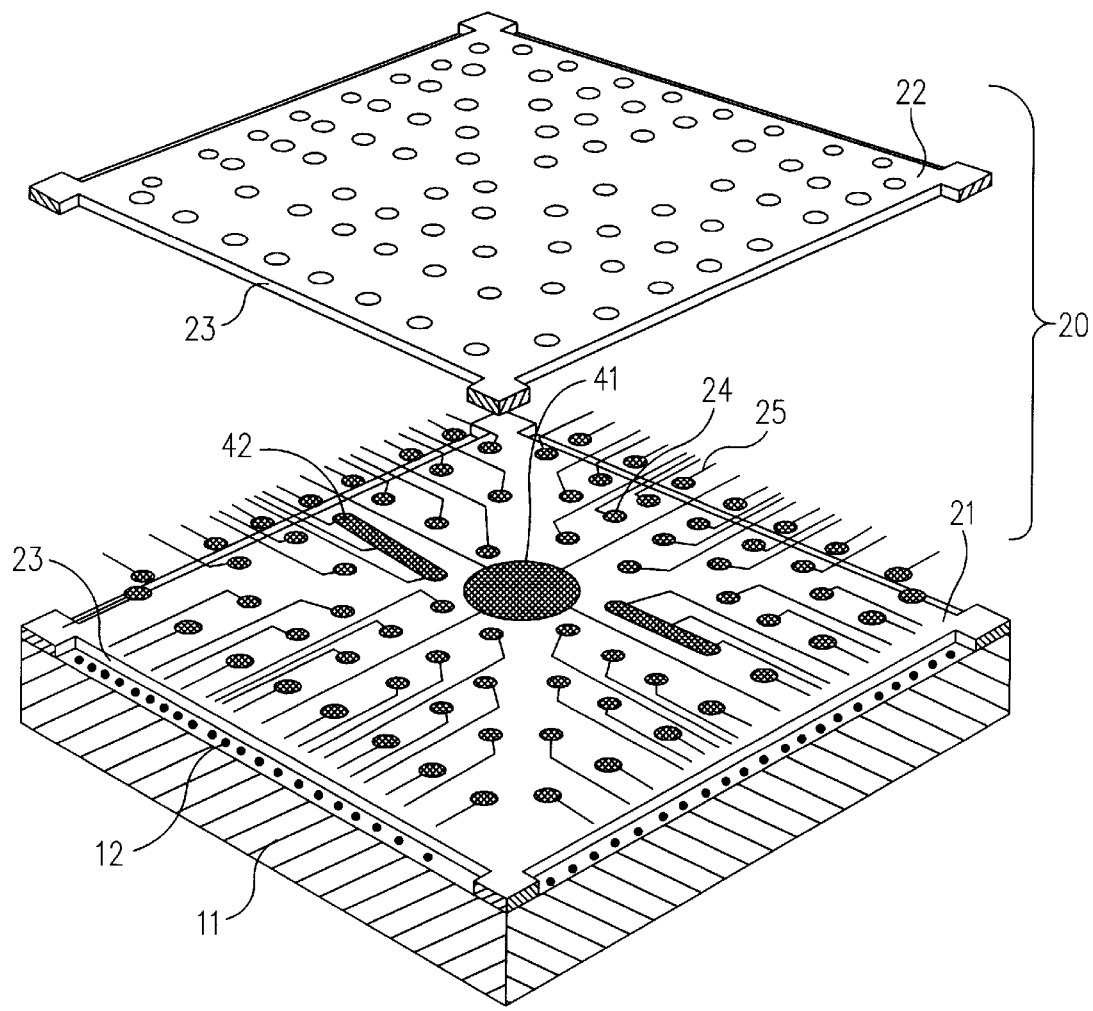

FIGS. 14A and 14B illustrate different embodiments of the circuit pattern 26 provided at the multi-layer film 20 in accordance with the present invention. As shown in FIGS. 14A and 14B, a plurality of circuit lines may be connected to the circuit pattern 26 so that the circuit pattern can be used as a power bonding 41 or ground bonding 42.

As apparent from the above description, the present invention provides a chip size package having a light, thin, simple and compact structure having a reduced size of its semiconductor chip while having an increased number of pins and without degrading its functions. In accordance with the present invention, it is possible to use either the semiconductor chip having bond pads arranged on end portions of the chip or the semiconductor chip having bond pads arranged on the central portion of the chip. In either case, input/output terminals of the package are arranged in the form of an area array. Accordingly, when the package is mounted on an electronic appliance, its mounting area can be minimized, thereby achieving a compactness of the final product.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor package comprising the steps of:

providing a wafer forming semiconductor chips each having an integrated electronic circuit and a plurality of bond pads each adapted to send a signal from the electronic circuit to the outside of the package;

forming a multi-layer film which has the same size as the wafer, consists of two non-conductive film layers and a conductive layer, and is formed by forming a conductive layer over a first non-conductive film which is a lower one of the two layers, patterning the conductive layer to form the circuit patterns, and laminating a second non-conductive film on the circuit patterns;

attaching the multi-layer film to the wafer by adhesive means in such a manner the bond pad regions defined at the semiconductor chips of the wafer are exposed through the opened portions of the multi-layer film;

bonding bond fingers provided at the circuit patterns of the multi-layer film to the bond pads of the semiconductor chips by wires, respectively;

covering a sealant layer over the opened portions of the multi-layer film, thereby protecting the wires from external oxidation and erosion;

baking the sealant layer in an oven or furnace at a temperature of 150° C. or more;

seating solder balls on solder ball lands provided at the multi-layer film, respectively, and reflowing the solder balls in the oven or furnace at a temperature of 200° C. or more, thereby bonding the solder balls to the circuit patterns;

cutting the wafer along its street lines using a sawing device so that it can be divided into individual semiconductor chips, thereby forming chip size packages having the same size as their semiconductor chips.

2. The method in accordance with claim 1, wherein the bond pads are arranged along end portions of the upper surface of each semiconductor chip.

3. The method in accordance with claim 1, wherein the bond pads are arranged along a central portion of the upper surface of each semiconductor chip.

4. The method in accordance with claim 1, wherein the second non-conductive film is opened in regions corresponding to solder ball lands where the solder balls are bonded to the circuit patterns and in regions where bond fingers provided at the circuit patterns are disposed so that the bond fingers can be connected to the bond pads by the wires.

5. The method in accordance with claim 4, wherein the solder ball lands are regularly arranged on an upper surface of the second film.

6. The method in accordance with claim 1, wherein the conductive layer has a thickness of 20 $\mu$m or less.

7. The method in accordance with claim 1, wherein the adhesive means comprises an epoxy adhesive or an adhesive film.

8. The method in accordance with claim 1, wherein the sealant layer is made of a polyimide coating solution, or an epoxy encapsulation material and covers the opened portions of the non-conductive film so that the wires can not be exposed.

9. The method in accordance with claim 1, wherein the solder balls are formed by laying a stencil screen printer having a plurality of through holes respectively corresponding to the solder ball lands on the multi-layer film, disposing solder powder on the stencil screen printer, blading the solder powder by a blade in such a manner that the solder powder is filled in the through holes on the solder ball lands, and reflowing the filled solder powder in the oven or furnace at a temperature of 220° C. or more so that the solder powder can be bonded to the circuit patterns at the solder ball lands while forming solder balls.

10. The method in accordance with claim 9, wherein the stencil screen printer is provided with grooves at portions of its bottom surface respectively corresponding to regions where the sealant layer is coated, so that the sealant layer can be protected.

11. The method in accordance with claim 1, wherein the solder balls, which are seated on the solder ball lands, are individually prepared to have a spherical shape prior to the seating step.

12. The method in accordance with claim 1, further comprising the steps of:

coating a flux on the solder ball lands prior to the step of reflowing the solder balls; and conducting a cleaning process to remove unnecessary residue of the flux after completing the reflowing of the solder balls.

13. The method in accordance with claim 1, wherein a plurality of circuit lines are connected to each circuit pattern so that the circuit pattern can be used as a power bonding or ground bonding.

* * * * *